United States Patent
Hou et al.

(10) Patent No.: US 11,825,617 B2
(45) Date of Patent: Nov. 21, 2023

(54) FOLDABLE DISPLAY APPARATUS

(71) Applicant: Yungu (Gu'an) Technology Co., Ltd., Hebei (CN)

(72) Inventors: Hongqi Hou, Kunshan (CN); Qi Shan, Kunshan (CN); Fu Liao, Kunshan (CN); Zhaoji Zhu, Kunshan (CN); Yongfeng Zhao, Kunshan (CN); Kanglong Sun, Kunshan (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 273 days.

(21) Appl. No.: 17/514,293

(22) Filed: Oct. 29, 2021

(65) Prior Publication Data
US 2022/0053654 A1 Feb. 17, 2022

Related U.S. Application Data

(63) Continuation of application No. PCT/CN2020/108721, filed on Aug. 12, 2020.

(30) Foreign Application Priority Data

Oct. 31, 2019 (CN) .......................... 201911054635.9

(51) Int. Cl.
*H05K 5/02* (2006.01)
*H10K 102/00* (2023.01)

(52) U.S. Cl.
CPC ..... *H05K 5/0217* (2013.01); *H10K 2102/311* (2023.02)

(58) Field of Classification Search
CPC .... H05K 5/0017; H05K 5/0226; H05K 1/189; H05K 1/028; H05K 2201/2027;
(Continued)

(56) References Cited

U.S. PATENT DOCUMENTS 9,173,288 B1 10/2015 Kim
9,874,048 B1 * 1/2018 Hsu ..................... E05D 11/1028
(Continued)

FOREIGN PATENT DOCUMENTS

CN 205942179 U 2/2017
CN 108076170 A 5/2018
(Continued)

OTHER PUBLICATIONS

International Search Report dated Nov. 17, 2020 in corresponding International Application No. PCT/CN2020/108721; 8 pages.
Chinese Office Action dated Mar. 3, 2021 in corresponding Chinese Application No. 201911054635.9; 12 pages.

*Primary Examiner* — Abhishek M Rathod
(74) *Attorney, Agent, or Firm* — Maier & Maier, PLLC

(57) ABSTRACT

In a foldable display apparatus, two second support parts and a first support part jointly support a flexible screen, a rotating part is slidably connected to the second support part on the same side of the first support part, and the second support part rotates relative to the first direction of the flexible screen and away from the first support part, a crackshaft is slidably connected with the rotating part to drive the rotating part to rotate therearound, a connecting lever drives the rotating part to slide toward the crankshaft along a thickness direction, the connecting lever is hinged at its two ends to the fixed portion and the rotating part respectively, the connecting rob is hinged at its two ends to the fixed portion and the second support part respectively, the bent portion of the flexible screen is U-shaped under the action of the second support parts.

20 Claims, 3 Drawing Sheets

(58) Field of Classification Search
CPC .... H05K 5/0086; H05K 5/0217; E05D 3/122; E05D 7/00; E05D 3/18; E05D 11/0054; E05D 11/0081; E05D 11/1028; E05D 11/105; E05D 3/06; E05D 3/12
See application file for complete search history.

(56) References Cited

U.S. PATENT DOCUMENTS

| | | | |
|---|---|---|---|
| 11,605,796 B2* | 3/2023 | Kim | G06F 1/1616 |
| 2016/0165024 A1 | 6/2016 | Tan et al. | |
| 2016/0295709 A1 | 10/2016 | Ahn | |
| 2019/0112852 A1* | 4/2019 | Hsu | G06F 1/1618 |
| 2020/0267851 A1* | 8/2020 | Hou | H04M 1/022 |
| 2020/0371553 A1* | 11/2020 | Hsu | G06F 1/1624 |
| 2020/0375046 A1* | 11/2020 | Sim | E05D 3/122 |
| 2021/0271294 A1* | 9/2021 | Liao | G06F 1/181 |

FOREIGN PATENT DOCUMENTS

| | | |
|---|---|---|
| CN | 207460248 U | 6/2018 |
| CN | 207777905 U | 8/2018 |
| CN | 207977991 U | 10/2018 |
| CN | 108965500 A | 12/2018 |
| CN | 208673636 U | 3/2019 |
| CN | 208908130 U | 5/2019 |
| CN | 109887417 A | 6/2019 |
| CN | 209070426 U | 7/2019 |
| CN | 110138936 A | 8/2019 |
| CN | 110310571 A | 10/2019 |
| CN | 110319110 A | 10/2019 |
| CN | 110324439 A | 10/2019 |
| CN | 110767091 A | 2/2020 |
| TW | M575877 U | 3/2019 |

* cited by examiner

FOLDABLE DISPLAY APPARATUS

CROSS-REFERENCE TO RELATED APPLICATIONS

This application is a continuation of International Application No. PCT/CN2020/108721, filed on Aug. 12, 2020, which claims priority to Chinese Patent Application No. 201911054635.9, filed on Oct. 31, 2019. Both of the above applications are hereby incorporated by reference in their entireties.

TECHNICAL FIELD

The present application relates to the technical field of display apparatuses, and in particular to a foldable display apparatus.

BACKGROUND

Compared with traditional display apparatuses, a foldable display apparatus has advantages of being foldable, lighter and thinner, which has become the development trend of display apparatuses.

The foldable display apparatus usually has three states: a front-folded state, a back-folded state, and an unfolded state. The foldable display apparatus usually includes a flexible screen and support parts for supporting the flexible screen. A switch among the front-folded state, the back-folded state, and the unfolded state of the foldable display apparatus can be realized by changing the shapes and positions of the support parts. When the foldable display apparatus is in the front-folded state, the support parts are located on both sides of the folded flexible screen; when the foldable display apparatus is in the back-folded state, the support parts are located between two halves of the half-folded flexible screen.

When the foldable display apparatus is in the front-folded state, the bent portion of the flexible screen is drop-shaped, the foldable display apparatus has a thick thickness after being folded, and due to a squeezing action on the bent portion of the flexible screen from the support parts, there will be a failure in the flexible screen so that it cannot be displayed normally.

SUMMARY

In view of the foregoing problem, embodiments of the present application provide a foldable display apparatus to solve the problem that the foldable display apparatus becomes thick and fails to display normally when the foldable display apparatus is in the front-folded state.

In order to achieve the foregoing objective, the embodiments of the present application provide the following technical solutions:

The first aspect of the embodiments of the present application provides a foldable display apparatus, which includes a flexible screen, a fixed portion, a support member, and two groups of rotating members;

a support member includes a first support part and two second support parts arranged on both sides of the first support part, and the two second support parts and the first support part jointly supports the flexible screen;
 two groups of rotating members are located on both sides of the first support part;
 each group of the rotating members includes a crankshaft, a rotating part, a connecting lever, and a connecting rod, where the rotating part is slidably connected to the second support part located on the same side of the first support part with the rotating part, the fixed portion is located at one end of the crankshaft, the connecting lever is hinged at its two ends to the fixed portion and the rotating part respectively, the crankshaft is slidably connected with the rotating part to drive the rotating part to rotate therearound, the connecting lever drives the rotating part to slide toward the crankshaft along a thickness direction of the flexible screen, the connecting rod is hinged at its two ends to the fixed portion and one of the second support part respectively, and the second support parts slide relative to the rotating part along a first direction of the flexible screen to a side away from the first support part.

Compared with related technologies, the foldable display apparatus provided by the embodiments of the present application has the following advantages.

In the foldable display apparatus provided by the embodiments of the present application, the foldable display apparatus includes a flexible screen, a support member, two groups of rotating members and a fixed portion, the support member includes an first support part and two second support parts arranged on both sides of the first support part, and the two second support parts and the first support part jointly support the flexible screen; the two groups of rotating members are located on both sides of the first support part, each group of the rotating members includes a crankshaft, a rotating part, a connecting lever, and a connecting rod, where the rotating part is slidably connected to the second support part located on the same side of the first support part with the rotating part, the fixed portion is located at one end of the crankshaft, the connecting lever is hinged at its two ends to the fixed portion and the rotating part respectively, the crankshaft drives the rotating part to rotate, the rotating part is slidably connected to the crankshaft, the rotating part slides toward the crankshaft along a thickness direction of the flexible screen, the connecting rod is hinged at its two ends to the fixed portion and one of the same second support part respectively, and the second support part slides relative to the rotating part along a first direction of the flexible screen to a side away from the first support part. The rotating part rotates under a combined action of the crankshaft and the connecting lever and slides toward the crankshaft, and the sliding direction is the thickness direction of the flexible screen. The second support part rotates under a combined action of the rotating part and the connecting rod, and slides relative to the rotating part toward the side away from the first support part, and the sliding direction is the first direction of the flexible screen. The bent portion of the flexible screen is U-shaped under the action of the second support parts, and the foldable display apparatus has a thin thickness after being folded in half; the flexible screen is fixed to the two second support parts, and the distance from the two second support parts to the first support part increases, and the bent portion of the flexible screen is not subjected to the squeezing action of the first support part. In this way, it is secured that the foldable display apparatus has a thin thickness and can display normally in the front-folded state.

In addition to the technical problem solved by the embodiments of the present application as described above, the technical features constituting the technical solutions and the beneficial effects produced by the technical features of these technical solutions, other technical problems solved by the foldable display apparatus provided by the embodiments of the present application, other technical features included in the technical solutions and the beneficial effects produced by these technical features will be further described in detail in the embodiments.

BRIEF DESCRIPTION OF DRAWINGS

In order to describe the technical solutions in the embodiments of the present application or related technologies more clearly, the following will briefly introduce drawings that need to be used in the description of the embodiments or related technologies. Obviously, the drawings described below are some embodiments of the present application, and for those of ordinary skill in the art, other drawings can be obtained based on these drawings without creative efforts.

DETAILED DESCRIPTION OF THE EMBODIMENTS

In order to make the purpose, features and advantages in embodiments of the present application clearer, the technical solutions in the embodiments of the present application will be described as follows clearly and comprehensively in conjunction with accompanying drawings in the embodiments of the present application. Apparently, the described embodiments are merely some rather than all embodiments of the present application. Based on the embodiments of the present application, all the other embodiments acquired by those skilled in the art without creative efforts shall fall into the protection scope of the present application.

An embodiment of the present application provides a foldable display apparatus. The foldable display apparatus may be, for example, a foldable mobile phone, and the foldable display apparatus can be folded in half along a folding line.

Figure 3:
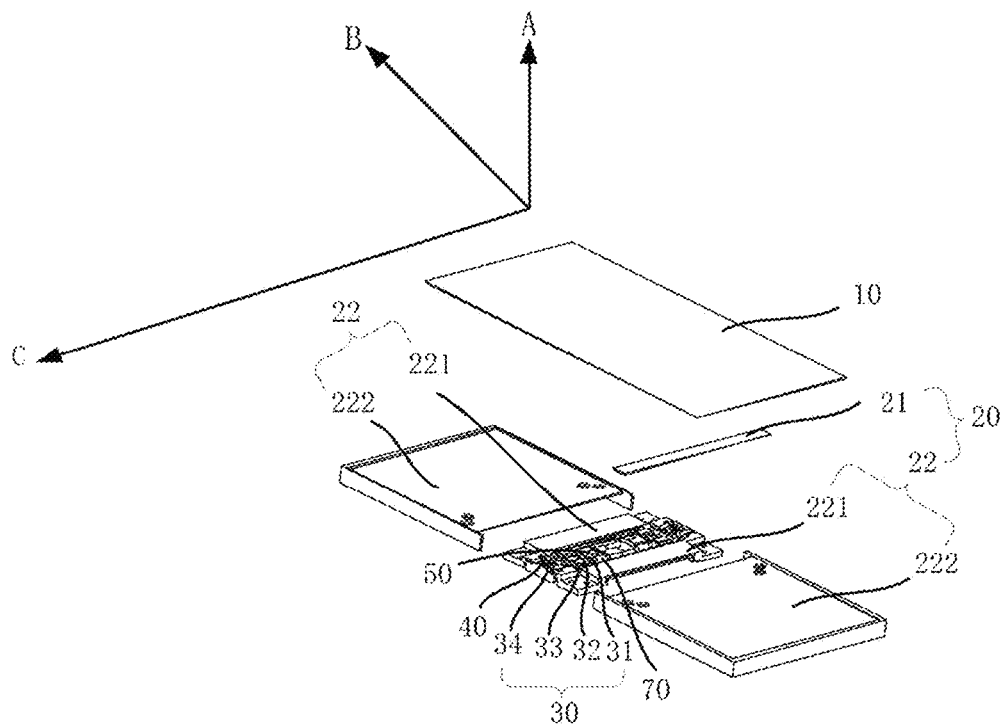
FIG. 3 is an exploded view of a foldable display apparatus according to an embodiment of the present application.

As shown in FIG. 3, the foldable display apparatus in the embodiment of the present application includes a flexible screen 10 and a support member 20. The flexible screen 10 may be, for example, a flexible organic light-emitting diode (OLED), and the support member 20 includes an first support part 21 and two second support parts 22 arranged on both sides of the first support part 21. The first support part 21 is in an elongated shape, for example, and the two second support parts 22 are, for example, located on both sides of the first support part 21 in a width direction, and the two second support parts 22 and the first support part 21 jointly support the flexible screen 10. In an embodiment, the flexible screen 10 is fixed to the two second support parts 22, while the flexible screen 10 is unbounded with the first support part 21. The flexible screen 10 is fixed to the two second support parts 22 in a manner of secured adhesion, for example, by OCA (Optically Clear Adhesive) optical adhesive or foam adhesive. The foldable display apparatus can be folded in half along the length direction of the first support part 21 (direction C in FIG. 3) as the folding line.

Figure 1:
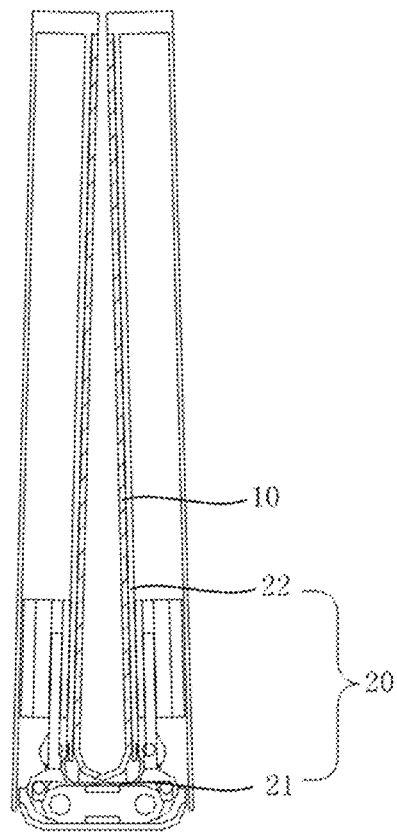
FIG. 1 is a schematic structural diagram of a foldable display apparatus in a front-folded state according to an embodiment of the present application.
Figure 2:
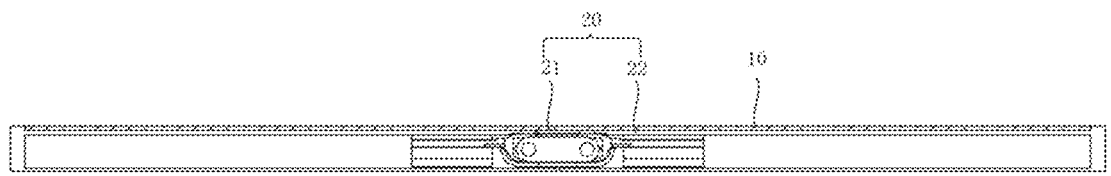
FIG. 2 is a schematic structural diagram of a foldable display apparatus in an unfolded state according to an embodiment of the present application.

The foldable display apparatus in the embodiment of the present application has at least two states: a front-folded state shown in FIG. 1 and an unfolded state shown in FIG. 2. In the unfolded state, the flexible screen 10 is supported on the first support part 21 and the two second support parts 22. In the front-folded state, the two second support parts 22 are located on both sides of the folded flexible screen 10.

Figure 4:
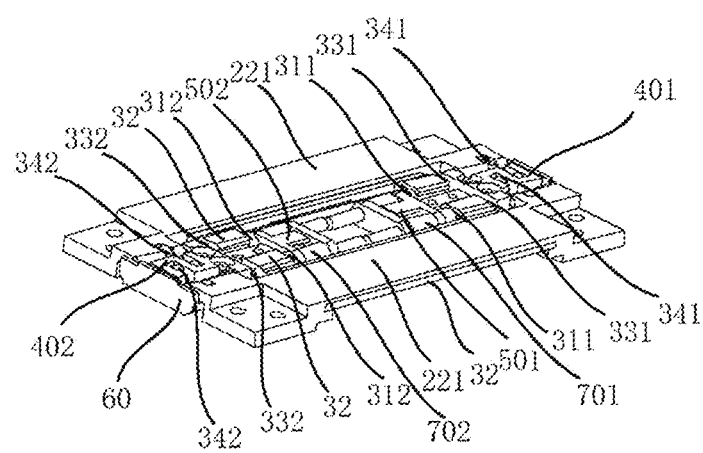
FIG. 4 is a schematic structural diagram of a foldable display apparatus according to an embodiment of the present application.

As shown in FIGS. 3 and 4, the foldable display apparatus in the embodiment of the present application further includes two groups of rotating members 30 and a fixed portion 40, where the two groups of rotating members 30 are located on both sides of the first support part 21. For example, the two groups of rotating members 30 are located on both sides of the elongated first support part 21 described above in the width direction, and the rotating member 30 and the second support part 22 on the same side of the first support part 21 are in corresponding arrangement.

Figure 5:
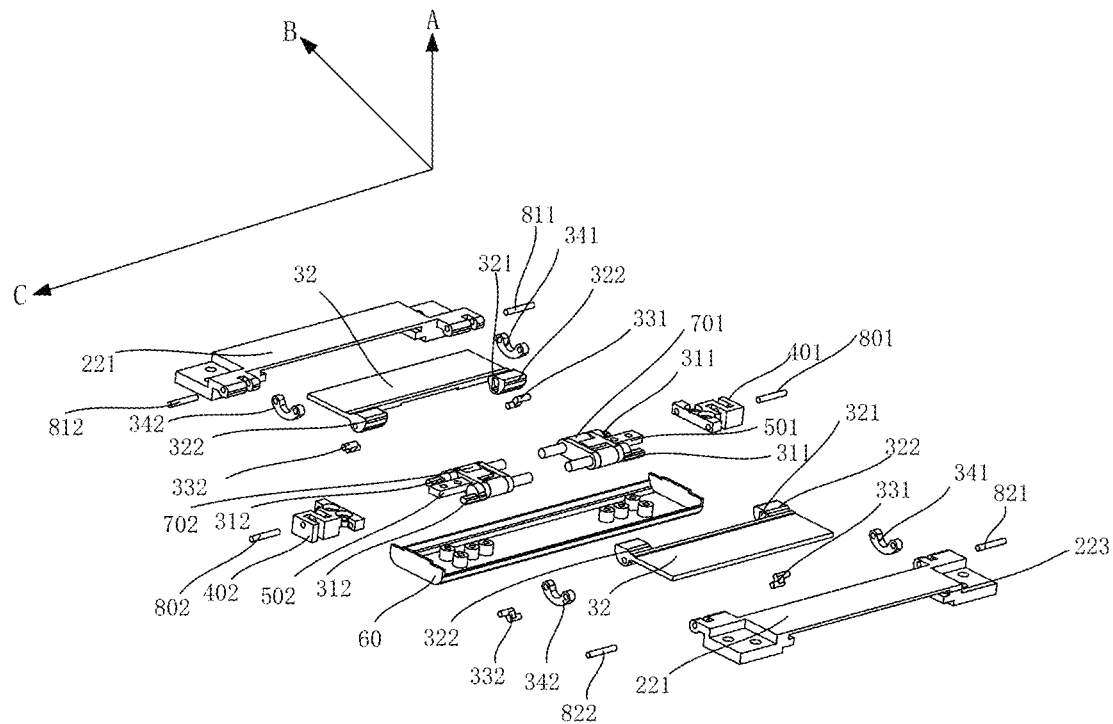
FIG. 5 is another exploded view of a foldable display apparatus according to an embodiment of the present application.

In the specific embodiment shown in FIGS. 3 to 5, each group of the rotating members 30 includes a crankshaft 31, a rotating part 32, a connecting lever 33, and a connecting rod 34. The rotating part 32 is slidably connected to the second support part 22 located on the same side of the first support part 21 with the rotating part 32. The crankshaft 31 is slidably connected with the rotating part 32 to drive the rotating part 32 to rotate therearound. The connecting lever 33 drives the rotating part 32 to slide toward the crankshaft 31 along the thickness direction of the flexible screen 10 (direction A in FIG. 3 and FIG. 5), the fixed portion 40 is located at one end of the crankshaft 31, the connecting lever 33 is hinged at its two ends to the fixed portion 40 and the rotating part 32 respectively, the connecting rod 34 is hinged at its two ends to the fixed portion 40 and the second support part 22 respectively, and the second support part 22 moves relative to the rotating part 32 along the first direction of the flexible screen 10 (direction B in FIG. 3 and FIG. 5) to a side away from the first support part 21.

When the two second support parts 22 are folded in half relative to the first support part 21 and in turn the flexible screen 10 is driven to be folded in half, the distance from the second support parts 22 to the first support part 21 increases, moreover, the flexible screen 10 is fixed to the two second support parts 22, and the flexible screen 10 is unbounded to the first support part 21, so that the bent portion of the flexible screen 10 is protected from being squeezed by the first support part 21, and the normal display of the flexible screen 10 is secured. At the same time, the first support part 21 can also support the first portion of the flexible screen 10. For the foldable display apparatus in the embodiment of the present application, since the connecting mode between the rotating part 32 and the second support part 22 and the connecting mode between the rotating part 32 and the crankshaft 31 are both slidable connections, the length change resulting from the closing and opening of the flexible screen 10 can be avoided, and the use of the connecting lever 33 and the connecting rod 34 can restrict the motion trajectory of the rotating part 32.

For the foldable display apparatus in the embodiment of the present application, the rotating part 32 rotates under a combined action of the crankshaft 31 and the connecting lever 33 and slides toward the crankshaft 31, where the sliding direction is the thickness direction of the flexible screen 10. The second support part 22 rotates under a combined action of the rotating part 32 and the connecting rod 34, and slides relative to the rotating part 32 toward the side away from the first support part 21, where the sliding direction is the first direction of the flexible screen 10. The bent portion of the flexible screen 10 is U-shaped under the action of the second support parts 22, and the foldable display apparatus has a thin thickness after being folded in half; the flexible screen 10 is fixed to the two second support parts 22, and the distance from the two second support parts 22 to the first support part 21 increases, and the bent portion of the flexible screen 10 is not squeezed by the first support part 21. In this way, it is secured that the foldable display apparatus has a thin thickness and can display normally in the front-folded state.

In a specific embodiment, the foldable display apparatus further includes synchronization mechanisms 70 connected to the crankshafts 31 of the two groups of rotating members 30. The crankshafts 31 of the two groups of rotating members 30 rotate synchronously under the action of the synchronization mechanisms 70. The crankshafts 31 rotate synchronously, so that the two half-folded portions of the foldable display apparatus move synchronously, specifically, the synchronization mechanism 70 includes, for example, a worm gear mechanism or a gear mechanism. When the number of shafts (including the worm gear) is odd, the synchronization mechanism 70 is a worm gear mechanism; when the number of shafts (including the worm gear) is even, the synchronization mechanism 70 is a gear mechanism, and there is no need to use a worm gear. The use of the synchronization mechanisms 70 can make the rotating members located on both sides of the first support part change the distance to the middle at the same time, reducing the overall thickness after folding.

In a specific embodiment, as shown in FIG. 3, the foldable display apparatus further includes rotating frames 50. The crankshafts 31 of the two groups of rotating members 30 are rotatably arranged on the rotating frames 50, and the rotating frames 50 can function to support the crankshaft 31.

In a specific embodiment, the first support part 21 is in an elongated shape, and each group of the rotating members 30 includes two crankshafts 31 symmetrically arranged along the length direction of the first support part 21 (direction C in FIG. 3 and FIG. 5), two connecting levers 33 symmetrically arranged along the length direction and two connecting rods 34 symmetrically arranged along the length direction, the fixed portion 40 has a first fixed portion 401 and a second fixed portion 402 symmetrically arranged along the length direction with the first fixed portion 401, the synchronization mechanism 70 has a first synchronization mechanism 701 and a second synchronization mechanism 702 symmetrically arranged along the length direction with the first synchronization mechanism 701, and the rotating frame 50 has a first rotating frame 501 and a second rotating frame 502 symmetrically arranged along the length direction with the first frame 501.

In the specific embodiment shown in FIGS. 4 and 5, the two crankshafts 31 of each group of the rotating members 30 are marked as a first crankshaft 311 and a second crankshaft 312, and the two connecting levers 33 of each group of the rotating members 30 are marked as a first connecting lever 331 and a second connecting lever 332, and the two connecting rods 34 of each group of the rotating members 30 are marked as a first connecting rod 341 and a second connecting rod 342.

Figure 6:
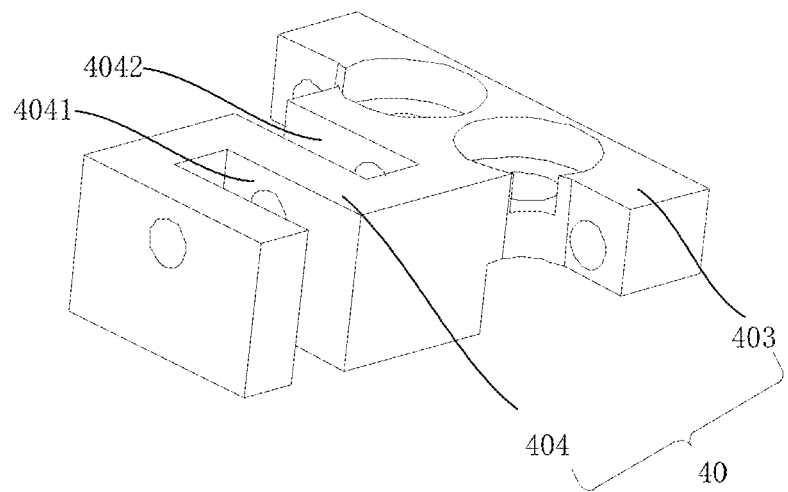
FIG. 6 is a schematic structural diagram of a fixed portion according to an embodiment of the present application.

In the specific embodiment shown in FIGS. 5 and 6, the affixed portion 40 includes an affixed portion 403 and an main portion 404 in a S shape and connected to one side of the affixed portion. The main portion 404 includes a first opening 4041 and a second opening 4042. The connecting levers 33 of the two groups of rotating members 30 are connected to the same fixed part 403, that is, the first connecting levers 331 of the two groups of rotating members 30 are all connected to the fixed portion 403 of the first fixed portion 401. The second connecting rods 342 of the two groups of rotating members 30 are connected to the affixed portion of the second fixed portion 402, and the connecting rods 34 of the two groups of rotating members 30 are respectively received in the first opening 4041 and the second opening 4042, that is, the first connecting rods 341 of the two groups of rotating members 30 are respectively received in the first opening 4041 and the second opening 4042 of the first fixed portion 401, and the second connecting rods 342 of the two groups of rotating members 30 are respectively received in the first opening 4041 and the second opening 4042 of the second fixed portion 402. In a specific example, the fixed portion 40 is integrally formed by the fixed portion 403 and the main portion 404.

In the specific embodiment shown in FIG. 5, an elongated hole 321 is provided at the position of the rotating part 32 corresponding to the crankshaft 31. The depth direction of the elongated hole 321 is the length direction of the first support part 22, and the size of the elongated hole 321 in the thickness direction of the flexible screen 10 is larger than the size of the elongated hole 321 in the first direction of the flexible screen 10. Specifically, the rotating part 32 is in an elongated shape, the length direction of the rotating part 32 is consistent with the length direction of the first support part 21, and the rotating part 32 has two installation protrusions 322 arranged on a side thereof and protruding to the crankshaft 31. Both of the two elongated holes are disposed on the two installation protrusions respectively and arranged oppositely, the depth direction of the elongated hole 321 is the length direction of the first support part 22, and the size of the elongated hole 321 in the thickness direction of the flexible screen 10 is larger than the size of the elongated hole 321 in the first direction. Correspondingly, opposite ends of the two crankshafts 31 of each group of the rotating members 30 are inserted into the corresponding elongated holes 321, respectively, and the side of one of the installation protrusions 322 away from the other one of the installation protrusions is connected to the connecting lever 33.

In the specific embodiment shown in FIGS. 4 and 5, the foldable display apparatus further includes a base 60, and the fixed portions 40, the first rotating frames 50 and the synchronization mechanisms 70 are arranged above the base 60, that is, the first fixed portion 401, the second fixed portion 402, the first synchronization mechanism 701, the second synchronization mechanism 702, the first rotating frame 501, and the second first rotating frame 502 are all arranged above the base 60. The first support part 21 is connected to the base 60 and located above the fixed portions 40 and the rotating frames 50, that is, the first support part 21 is located above the first fixed portion 401, the second fixed portion 402, the first synchronization mechanism 701, the second synchronization mechanism 702, and the first rotating frame 501 and the second rotating frame 502.

In the specific embodiment shown in FIG. 3, each group of the second support parts 22 includes a support frame 221 and a support part 222 connected to the support frame 221. The flexible screen 10 is located above the support part 222 and the connecting rod 34 and the support frame 221 located on the same side of the first support part 21 are hinged, and the support part 222 is slidably connected to the rotating part 32 located on the same side of the first support part 21.

In the specific embodiment shown in FIG. 5, a slide 223 is provided on the side of the support part 222 away from the flexible screen 10, the rotating part 32 may be, for example a plate, and the rotating part 32 located on the same side of the first support part 21 is inserted into the slide 223. The connecting rod 34 is hinged at its two ends to respectively the corresponding fixed portion 40 and the corresponding second support part 22 via connecting rod pins 801, 802, 811, 812, 821, and 822. Specifically, the two connecting rods 341 of the two groups of rotating mechanisms 30 are hinged to the fixed portion 401 via the connecting rod pin 801, the two connecting rods 342 of the two groups of rotating mechanisms 30 are hinged to the fixed portion 402 via the connecting rod pin 802, the other end of the connecting rod 341 is hinged to the second support part 22 via the connecting rod pin 811 or 812, and the other end of the connecting rod 342 is hinged to the second support part 22 via 821 or 822.

For the foldable display apparatus in the embodiment of the present application, the crankshaft 31 drives the rotating part 32 to rotate. The rotating part 32 slides toward the crankshaft 31 under the action of the connecting lever 33, and the sliding direction is the thickness direction of the flexible screen 10. The bent portion of the flexible screen 10 is U-shaped under the action of the support part 222. The rotating part 32 drives the support frame 221 to rotate. The support frame 221 slides relative to the rotating part 32 under the action of the connecting rod 34, and the sliding direction is the first direction of the flexible screen 10. The bent portion of the flexible screen 10 is not subjected to the squeezing action of the first support part 21. In this way, it is ensured that the foldable display apparatus has a thin thickness and can display normally in the front-folded state.

Finally, it should be noted that the above embodiments are only used to illustrate the technical solutions of the present application, but not to limit it; although the present application has been described in detail with reference to the foregoing embodiments, those of ordinary skill in the art should understand that, they can make modifications to the technical solutions described in the foregoing embodiments, or equivalently replace some or all of the technical features therein; and these modifications or replacements do not cause the essence of the corresponding technical solutions to deviate from the scope of the technical solutions in the embodiments of the present application.

What is claimed is:

1. A foldable display apparatus, comprising:
    a flexible screen;
    a fixed portion;
    a support member comprising a first support part and two second support parts arranged on both sides of the first support part, wherein the two second support parts and the first support part jointly support the flexible screen; and
    two groups of rotating members, wherein the two groups of rotating members are located on both sides of the first support part, and
    each group of the rotating members comprises a crankshaft, a rotating part, a connecting lever and a connecting rod, wherein the rotating part is slidably connected to the second support part located on the same side of the first support part with the rotating part, the fixed portion is located at one end of the crankshaft, the connecting lever is hinged at its two ends to the fixed portion and the rotating part respectively, the crankshaft is slidably connected with the rotating part to drive the rotating part to rotate therearound, the connecting lever drives the rotating part to slide toward the crankshaft along a thickness direction of the flexible screen, the connecting rod is hinged at its two ends to the fixed portion and one of the second support parts respectively, and the second support parts slide relative to the rotating part along a first direction of the flexible screen to a side away from the first support part.

2. The foldable display apparatus according to claim 1, further comprising: a synchronization mechanism connected with the crankshafts of each group of the rotating members.

3. The foldable display apparatus according to claim 2, wherein the synchronization mechanism comprises a worm gear mechanism or a gear mechanism.

4. The foldable display apparatus according to claim 2, further comprising: an rotating frame, wherein the crankshafts of the two groups of rotating members are rotatably arranged on the rotating frame.

5. The foldable display apparatus according to claim 4, wherein the first support part is in an elongated shape, each group of the rotating members comprises two crankshafts symmetrically arranged along a length direction of the first support part, two connecting levers symmetrically arranged along the length direction and two connecting rods symmetrically arranged along the length direction, the fixed portion has a first fixed portion and a second fixed portion symmetrically arranged along the length direction with the first fixed portion, and the rotating frame has a first rotating frame and a second rotating frame symmetrically arranged along the length direction with the first frame.

6. The foldable display apparatus according to claim 2, wherein the first support part is in an elongated shape, each group of the rotating members comprises two crankshafts symmetrically arranged along a length direction of the first support part, two connecting levers symmetrically arranged along the length direction and two connecting rods symmetrically arranged along the length direction, the fixed portion has a first fixed portion and a second fixed portion symmetrically arranged along the length direction with the first fixed portion, and the synchronization mechanism has a first synchronization mechanism and a second synchronization mechanism symmetrically arranged along the length direction with the first synchronization mechanism.

7. The foldable display apparatus according to claim 1, wherein the fixed portion comprises an affixed portion and a main portion in an "S" shape and connected to one side of the affixed portion, the main portion comprises a first opening and a second opening; and
    the connecting levers of the two groups of rotating members are connected with the affixed portion; and the connecting rods of the two groups of rotating members are arranged in the first opening and the second opening respectively.

8. The foldable display apparatus according to claim 7, wherein the fixed portion comprises a first fixed portion and a second fixed portion, wherein the connecting rod of each group of the rotating members comprises a first connecting rod and a second connecting rod, and the first connecting rods of the two groups of rotating members are respectively received in the first opening and the second opening of the first fixed portion, the second connecting rods of the two groups of rotating members are respectively disposed in the first opening and the second opening of the second fixed portion.

9. The foldable display apparatus according to claim 4, further comprising a base, the fixed portion and the synchronization mechanism are arranged above the base, and the first support part is located above the fixed portion and the synchronization mechanism.

10. The foldable display apparatus according to claim 9, wherein the first rotating frame are arranged above the base, and the first support part is located above the fixed portions and the rotating frames.

11. The foldable display apparatus according to claim 1, wherein each group of the second support parts comprises a support frame and a support part connected to the support frame, the flexible screen is located above the support part, the connecting rod and the support frame located on the same side of the first support part are hinged together, and the support part is slidably connected to the rotating part located on the same side of the first support part.

12. The foldable display apparatus according to claim 11, wherein a slide is provided on a side of the support part away from the flexible screen, and the rotating part on one side of the first support part is inserted into the slide.

13. The foldable display apparatus according to claim 5, wherein the rotating part has an elongated hole corresponding to the crankshaft, a depth direction of the elongated hole is consistent with the length direction of the first support part, and a size of the elongated hole in the thickness direction of the flexible screen is larger than a size of the elongated hole in the first direction of the flexible screen.

14. The foldable display apparatus according to claim 13, wherein the rotating part is in an elongated shape, a length direction of the rotating part is consistent with the length direction of the first support part, and the rotating part has two installation protrusions arranged on a side thereof and protruding to the crankshaft, and the two elongated holes are disposed on the two installation protrusions respectively and arranged oppositely.

15. The foldable display apparatus according to claim 14, wherein two ends of the crankshafts of each group of the rotating members are inserted into the corresponding elongated holes and a side of one of the installation protrusions away from the other one of the installation protrusions is connected to the connecting lever.

16. The foldable display apparatus according to claim 1, wherein the two ends of the connecting rod are respectively hinged with a corresponding fixed portion and the corresponding second support part via a connecting rod pin.

17. The foldable display apparatus according to claim 1, wherein the rotating part is a panel.

18. The foldable display apparatus according to claim 1, wherein the flexible screen comprises a flexible organic light emitting diode (OLED).

19. The foldable display apparatus according to claim 1, wherein the flexible screen is fixed to the two second support parts and unbounded with the first support part.

20. The foldable display apparatus according to claim 19, wherein the flexible screen is fixed to the two second support parts in a manner of secured adhesion by an optical adhesive or a foam adhesive.

* * * * *